United States Patent [19]

Nivelle

[11] Patent Number: 5,553,163
[45] Date of Patent: Sep. 3, 1996

[54] POLYTOMOUS SEGMENTATION PROCESS

[75] Inventor: François Nivelle, Tours, France

[73] Assignee: Thomson-CSF, Puteaux, France

[21] Appl. No.: 383,652

[22] Filed: Feb. 3, 1995

Related U.S. Application Data

[63] Continuation of Ser. No. 996,636, Dec. 24, 1992, abandoned.

[30] Foreign Application Priority Data

Dec. 26, 1991 [FR] France .................... 91 16160

[51] Int. Cl.[6] .................................................. G06K 9/68
[52] U.S. Cl. .............................. 382/227; 382/228
[58] Field of Search ........................... 382/173, 181, 382/224, 225, 226, 227, 228

[56] References Cited

U.S. PATENT DOCUMENTS

| | | | |
|---|---|---|---|
| 4,658,429 | 4/1987 | Orita et al. | |
| 4,682,365 | 7/1987 | Orita et al. | |
| 4,754,489 | 6/1988 | Bokser | 382/37 |
| 4,802,230 | 1/1989 | Horowitz | 382/37 |
| 4,831,657 | 5/1989 | Casey et al. | 382/37 |
| 4,944,023 | 7/1990 | Imao et al. | 382/37 |
| 4,989,258 | 1/1991 | Takahashi et al. | 382/37 |
| 5,034,991 | 7/1991 | Hagimae et al. | 382/37 |

OTHER PUBLICATIONS

Proceedings of Eusipco 88 Fourth European Signal Processing Conf., vol. 3, Oct. 5, 1988, Grenoble, FR, T. N. Daskalakis, et al "A Graph–Theoretic Algorithm For Unsupervised Image Segmentation", p. 1623.

IEEE Transactions On Pattern Analysis and Machine Intelligence, IEEE Computer Society Press, vol. 13, No. 4, Apr. 1991, New York, pp. 340–354, "Optimal Partioning For Classification and Regression Trees".

Pattern Recognition, Pergamon Press, vol. 23, No. 12, 1990, Oxford, UK, pp. 1367–1376, T. E. Flick et al, "Pattern Classification Using Projection Pursuit", p. 1368.

Michael R. Anderberg, "Cluster Analysis For Applications", 1973, Academic Press Inc., New York, U.S., p. 66.

*Primary Examiner*—Stephen Chin
*Assistant Examiner*—Timothy J. May
*Attorney, Agent, or Firm*—Oblon, Spivak, McClelland, Maier & Neustadt, P.C.

[57] ABSTRACT

The segmentation process of the invention consists in making representative objects of classes to be discriminated and for which a statistical law is estimated or is available which defines them on characteristic measurements. The data base is segmented by determining cuts between the classes taken two by two, the cuts being computed using the descriptive parameters of the statistical laws of each class. Each new object is assigned to the most probable class.

11 Claims, No Drawings

POLYTOMOUS SEGMENTATION PROCESS

This application is a continuation of application Ser. No. 07/996,636, filed on Dec. 24, 1992, now abandoned.

BACKGROUND OF THE INVENTION

1. Field of the Invention

This invention has as its object a polytomous segmentation process, it being understood that it can include dichotomous segmentation.

2. Discussion of the Background

Segmentation, or treelike distribution of sample units (any objects, images, systems, various data, . . . ) is known under the English names of "decision tree" or "tree classifier".

Polytomous segmentation is used in the field of data analysis, shape recognition and discrimination, indeed of automatic classification of data. Standard segmentation methods are called "dichotomous." The use of these methods on explanatory variables (single or multidimensional representation of a measurement) provides a Boolean interpretation of the variable to be explained (interpretation or type attached to the measurement). The result of these standard segmentation methods appears in the form of binary functions that are simple to use.

In a process of analysis of data or of discrimination separated into an inference phase (learning) and a decision phase (generalization), these methods offer certain advantages:

During the learning phase, they make it possible to measure the discrimination ability of the explanatory variables and to provide a description of the discriminatory analysis that can be easily interpreted.

During the generalization phase, in addition to the extreme rapidity of classification (decisions at thresholds in finite number), the user can influence the classification of a sample unit by including in the segmentation criteria a priori knowledge depending on the effect that he desires. The obtained decision rule resembles the methods of decision by successive approximations that are common in human reasoning, and makes it possible to develop between the user and the computer a very clear interactivity that is not found in the other methods of discrimination.

To cite only the most used of these other methods;

standard discriminatory analysis provides decision rules expressed in the form of algebraic expressions that are often difficult to use;

the method of the closest related K's is sensitive to the metric used and remains, despite the recent work on faster variants, very costly in computation time.

The standard methods, however, exhibit the following drawbacks. A standard segmentation method is based on a binary spitting on the variable or variables of the measurement. When the choice or the interpretation to be given of the measurement is binary (choice No. 1 or choice No. 2), they are perfectly suited, but when it is necessary to choose between several possible choices (>2) decision conflicts can result when the segmentation is redone several times with different choice pairs, for example:

X is unknown and can belong to classes No. 1, No. 2 or No. 3

1st phase: class No. 1 against class No 2+class No. 3 X is assigned to class No. 1

2nd phase: class No. 2 against class No. 1+class No. 3 X is assigned to classes No. 1 + No. 3

3rd phase: class No. 3 against class No. 1+class No. 2 X is assigned to class No. 3

Such a situation is due to the assignment errors during each phase and leads to an uncertainty. Further, the number of phases has been multiplied, therefore the number of chances of indecision has been multiplied and the cost of a decision (in time and/or in equipment) has been increased.

Certain variants, at each step, choose the best (in the sense of a specific criteria) classes or the best groups of classes to oppose two by two.

In the latter case, the number of phases is limited to a single one, and also the chances of indecision are limited, but then the a posteriori interpretation of the analysis is complicated by increasing the number of tests and of segments through which the measurement passes.

A final constraint of the standard methods comes from their nonparametric nature, i.e., the search for the optimal split between two classes is performed by a counting of the data on each side of the split, which makes difficult, on the one hand, the generalization of the method when the statistical properties of the measurements are known, and on the other hand, leads to prohibitive computation times when the number and content of the measurements become considerable.

These methods are, for example, described in the following works. BREIMAN L., FRIEDMAN JH., OHLSEN RA. and STONE CJ.: "Classification and Regression Trees" WADSWORTH Publications 1984. CELEUX G. and LECHEVALIER Y.: "Methodes de segmentation non-parametrique, Revue de statistiques appliguées" ["Nonparametrique Segmentation Methods, Applied Statistics Journal"] Vol. XXX, 4 pp. 39–53 - 1982. FRIEDMAN JH.: "A recursive partitionary decision rule for nonparametric classification" IEEE Trans-Computer pp. 404–408 - April 1977. GUEGUEN A. and NAKACHE JP.: "Méthode de discrimination base sur la construction d'un arbre de decision binaire" ["Discrimination method based on the construction of a binary decision tree"], Applied Statistics Journal, XXXVI, 1 pp. 19–38 - 1988. BERGONIER H. and BOUCHARENC L.: "Méthode de segmentation basée sur la théorie de l'information," M. DASSAULT Prize - 1967.

SUMMARY OF THE INVENTION

This invention has as its object a segmentation process that makes it possible to classify sample units as simply and as fast as possible by taking into account one or more criteria, and this, regardless of the number of classes considered.

According to the process of the invention, a data base is made up from several populations of representative sample units of classes of sample units to be discriminated for which a statistical law is available defining them on at least one characteristic variable, and in the absence of this, the unknown laws are estimated using the data, after having ordered the populations on each characteristic variable, the data base is segmented, in at least as many parts as appeared of it in said data base, by determining splits discriminating the ordered classes taken two by two, and each new sample unit is classified whose value of its characteristic variables in the most probable class are known for the part where the sample unit is found. In the case where several characteristic variables are available, the one is chosen that offers the best discrimination possible between classes by minimization of the variance inside the classes and maximization of the variance between classes.

According to one of the aspects of the invention, the splits are computed from the knowledge or from the estimation of the descriptive parameters of the related statistical laws two by two.

According to an aspect of the process of the invention, the segmentation is performed as long as significant impurities remain in the classes. Advantageously, at each new segmentation at least one stop test is performed calling for the stopping of the segmentation as soon as the reduction of the impurities is no longer effective. Preferably, the stop tests comprise at least one of the following verifications: acceptable impurity threshold for a class, minimum population of a class, maximum number of classes, maximum number of segmentation levels.

DETAILED DESCRIPTION OF THE PREFERRED EMBODIMENTS

This invention will be better understood on reading the detailed description of several modes of application, taken by way of nonlimiting examples.

First, a segmentation algorithm in the case of two classes will be described. Either a data base of N sample units described in a representation space $R^n$ by n quantitative variables: each sample unit $X_i$ is represented by a vector $R^n$, $(X_{i1}, X_{i2}, X_{i3}, \ldots, X_{in})$. Furthermore, this data base is partitioned into two classes $W_1$ and $W_2$ such that:
Card $(W_1) = N_1$ and Card $(W_2) = N_2$ with $N_1 + N_2 = N$ Each sample unit $X_i$ is assigned a priori to one of the two classes $W_1$ or $W_2$. This places us in the case of the Bayes theory of decision. It is therefore necessary to introduce on $R^n$ a measurement, a decision function, or characteristic function $h_j(X)$ that makes it possible to classify any sample unit X in one of said two classes.

As decision function, the characteristic functions of the probability densities are used, estimated from a learning data base $T\{(X, W_j)\}$.

In practice, only the Gaussian laws are considered below, but of course the invention is not limited to these laws, and the use of the process of the invention with other laws will be easy for a person skilled in the art on reading this description. By taking the logarithms of the probability densities, the characteristic functions have the form:

$$h_j(XX) = \{(X-\bar{X}_j)'\Sigma^{-1}(X-X_j)\} + [Log\ |\Sigma| - 2\ Log\ (p(W_j))]$$

or $d_j(X)$ the first term of $h_j(X)$, which is none other than the Mahalanobis distance $$d_j(X) = (X-\bar{X}_j)'\Sigma^{-1}(X-\bar{X}_j)$$

In most cases, the second term of $h_j(X)$ is insignificant in front of $d_j(X)$. By disregarding it, the decision function becomes particularly simple: X is classified in class $W_j$ whose distance $d_j(X)$ is the smallest. If the classes are equiprobable, the separating surface is a hyperplane.

In the case of one-dimensional variables, this separator amounts to a point X" representing the optimal separator between the classes $W_1$ and $W_2$. These classes are defined, in the case of Gaussian laws of probability, by the mean and the standard deviation of their sample units.

The case of a single explanatory variable (n=1) will now be examined. In the case of two classes each defined by a one-dimensional Gaussian, the point X" which optimally separates the two classes is determined in the following way:

$$d_1(X^*) = d_2(X^*) \rightarrow \frac{(X^* - \bar{X}_1)^2}{\sigma_1^2} = \frac{(X^* - \bar{X}_2)^2}{\sigma_2^2}$$

It can very easily be shown that the point X" belongs to the segment $[X_1; X_2]$. The formula above is then rewritten:

$$\frac{(X^* - \bar{X}_1)}{\sigma_1} = -\frac{(X^* - \bar{X}_2)}{\sigma_2} \rightarrow X^* = \frac{\bar{X}_1 \cdot \sigma_2 + \bar{X}_2 \cdot \sigma_1}{\sigma_1 + \sigma_2}$$

By analogy with the mechanics, it can be said that point X" represents the center of gravity of points $X_1$ and $X_2$ of mass $1/\sigma_1$ and $1/\sigma_2$.

Having determined point X", data base $T(X, W_j)$ is cut into two subgroups in the following way:

$$\forall X_i \in T \begin{cases} X_i \in T_1\ \text{if}\ X_i \leq X^* \\ X_i \in T_2\ \text{if}\ X_i > X^* \end{cases}$$

Diagrammatically, the segmentation procedure is represented the form of a dichotomous tree:

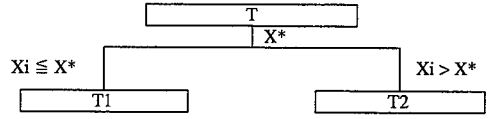

With Card $\{T_1\}$ + Card $\{T_2\}$ = Card $\{T\}$

In each of the partitions of T, $T_1$, and $T_2$, the procedure is reiterated by considering that each child segment obtained by iteration γ becomes a parent segment with iteration γ+1 to be partitioned in turn into two child segments. Let us note that a parent segment can be split only if the number of classes is significantly higher than two (each class is sufficiently represented).

This procedure makes it possible to construct a dichotomous segmentation tree where the explanatory variable selected is always the same and where only the value of the segmentation threshold is caused to be modified.

The process of the invention can be extended to the case of several explanatory variables. The choice of the most discriminatory explanatory variable will first be described. If the representation space is of dimension p, it is necessary to choose wisely the explanatory variable according to which the population of sample units will be partitioned. The explanatory variable selected must offer the best discrimination possible in the sense of discriminatory analysis (minimization of the variance inside the classes and maximization of the variance between the classes).

For each explanatory variable $X_j$, the value of the optimal threshold $X"_j$, (j=1, p) is sought and a new measurement $\omega^j_{12}$ is defined that makes it possible to figure out the discrimination provided by the segmentation according to variable $X_j$ between classes $W_1$ and $W_2$.

$$\omega^j_{12} = \sum_{i=1}^{2} \sum_{x} P(X, W_i) \cdot Log\left(\frac{P(X|W_i)}{P(X)}\right)$$

with Log: Napierian logarithm
X: sample unit well classed by the segmentation and $$P(X, W_i) = \frac{N_{X, W_i}}{N}$$

$$P(X|W_i) = \frac{N_{X, W_i}}{N_i}$$

-continued $$P(X) = \frac{N_X}{N}$$

N: total number of sample units, all classes intermingled
$N_x$: number of well-classed sample units, all classes intermingled
$N_1$: total number of sample units of class $W_i$ $N_{x,wi}$: number of well-classed sample units of class $W_i$ For each variable $X^j$, $\omega^j_{12}$ is computed and variable $X^k$ for which $\omega^k_{12}$ is maximum is selected:

$$\omega^k_{12} > \omega^j_{12}; \forall j \neq k \ (j=1, p)$$

The scatter of sample units is segmented according to threshold $X''_k$ corresponding to variable $X_k$. The representation of this partitioning corresponds to the diagram below:

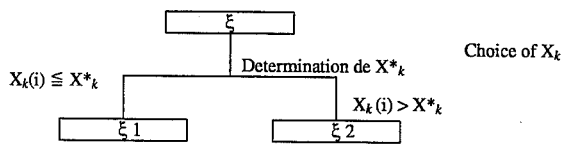

On each of the new child segments, the procedure is reiterated in the same way.

Using this process, a segmentation tree is constructed where at each level the total number of sample units is constant (population of sample units present in the original parent segment), but where the number of representatives per child segment is strictly lower than the number of sample units contained in the parent segment:

$$Card \ (\xi_1) + Card \ (\xi_2) = Card \ (\xi)$$

$$Card \ (\xi_1) < Card \ (\xi) \ (i=1,2)$$

As is generally the case in all segmentation, a limit to the segmentation is determined by stop tests.

Using these segmentation criteria, it is possible to define a splitting condition for any segment S. If on all the sample units contained in segment S, the descriptive variable presents a dichotomy of its characteristics, it is envisaged to divide this segment into two child segments; but, in the case where the sample units of the two classes are very mingled, the segmentation not providing additional discrimination, it is useless, indeed detrimental.

Therefore, two new criteria $\omega^i_{12}$ and $\omega^f_{12}$:
$\omega^i_{12}$: initial, or a priori, criterion measuring the mingling of the classes in segment S.
$\omega^f_{12}$: final, or a posteriori, criterion measuring the mingling of the classes on all the S child segments.

These criteria are expressed: $\omega^i_{12}$: Equivalent to criteria $\omega_{12}$ defined for the choice of the variable to be segmented.
$\omega^f_{12}$: Sum of the criteria $\omega_{12}$ on all the child segments.
Having computed these two criteria, the difference is tested:

$$D=(\omega^f_{12}-\omega^i_{12})$$

So that the segmentation has a meaning, it is necessary that D be positive. If this is not the case, segment S is not processed which then becomes a terminal segment (the "leaf" of the treelike structure is reached).

The criterion for division of a segment is based on a reduction of the impurity of this segment. If this reduction is effective, the segmentation is authorized, otherwise the segment is declared terminal.

Nevertheless, the search alone for reduction of the impurity can lead to very many divisions, the tree is very large and provides, at the end of the decision phase, an over-optimistic classification probability, far from the real classification level obtained with the test data base in decision phase.

To avoid this, a battery of additional tests, known in the art, rounds out the process of the invention. These are:
threshold on the acceptable impurity for a segment;
minimum population of a segment (percentage of the population of the original segment);
maximum number of segments;
maximum number of levels in the segmentation tree.

It will be noted that since the process of the invention is based on a parametric estimation of the probability densities of the various populations, the number of sample units present in a segment must be sufficient for the error on the estimation of the parameters not to be too great.

If a child segment verifies the stop test of the procedure, it is assigned to the class of majority points in this segment and becomes a terminal segment, it will no longer be segmented. The procedure is applied to another child segment and continues as long as a nonterminal segment remains.

After the splitting of a segment, systematically dividing the segment containing the partition that is complementary to the one previously processed is not selected. The segment that gives the best value of the discrimination criteria $\omega^j_{12}$ defined above is considered.

Therefore, with iteration $\gamma$, there are available K nonterminal segments, and, per segment, variable $X_j$ is sought, from segmentation threshold $X''$ and from criterion $\omega^j_{12}$. It is chosen to follow the procedure with iteration $\gamma+1$ by processing segment S such that:

$$\omega^j_{12}(S) = \max_k \left[ \max_i [\omega^j_{12}(S_k)] \right]$$

The learning phase (or descriptive phase) makes it possible to construct a dichotomous segmentation tree. A nonterminal segment always has two child segments defined from the parent segment by thresholding on a set variable. The unique class or the majority class of the sample units of this segment is dedicated to any terminal segment.

To classify a new sample unit, it is made to undergo, from the original segment, the series of tests corresponding to its flow in the tree, and when it falls into a terminal segment the class corresponding to this final segment is assigned to it.

The process of the invention, set forth above in the case of two classes can be extended to multiclass problems by considering each class in comparison with all the others.

According to the prior art, in the case of K classes present in the learning sample, K dichotomous segmentation trees are constructed, where each parent segment provides one child segment dedicated to the class processed, and a second child segment dedicated to all the other intermingled classes. The learning procedure is then slower, as well as the decision phase. Furthermore, if each of the K sequences is considered independent of the others, the assignments can be multiple: actually, if a sample unit is identified as belonging to a set class, because it fell into a terminal segment labeled as part of this class during the descriptive phase, nothing is standing in the way of it undergoing a different identification during one of the K-1 decision phases that it must undergo. If such a case occurs, the sample unit being impossible to classify, it can only be rejected. Over all the test population many objects can thus be rejected, bringing about an appreciable reduction in discrimination ability.

The process of the invention is a process that makes it possible to classify a sample unit uniquely, this from a single segmentation tree constructed during a single learning phase. The tree obtained is no longer dichotomous: each parent segment is divided into at least as many child segments as there are meaningful classes.

First, the case of a single variable will be examined. It has been seen, in the case of two classes that it is possible to separate optimally two Gaussians by point X", the intersection of the separator with the axis of the barycenters of the scatters of sample units. In the case of multiple classes, this point $X''_j$ is always in the segment $[X_j, X_{i+1}]$, therefore if K classes are counted, it is possible to determine the K-1 points $X''_i$ (i=1, K-1) separating two by two the classes $W_i$ and $W_{i+1}$ ordered according to the increasing order of the barycenters $X_j$ (j=1, k) of each of the K classes projected on the explanatory variable $X_o$.

$$\frac{W_1}{X_1,} \mid \frac{W_2}{\sigma_1 X_2, \sigma_2} \mid \frac{W_i}{X_j, \sigma_i} \quad \frac{W_K}{X_K, \sigma_K} \ldots + \ldots \quad \mid \longrightarrow X_o$$

$$X_1 \leq X_2 \leq \ldots \leq X_i \leq \ldots \leq X_K$$

Therefore, the characteristic parameters of the variable to be explained are rearranged so as to satisfy this arrangement of the barycenters according to the explanatory variable $X_o$.

In the same way as before, the thresholds $X'_i$ (i=1, K-1) are determined by the formula:

$$X_i^* = \frac{\overline{X}_i \sigma_{i+1} + \overline{X}_{i+1} \sigma_i}{\sigma_i + \sigma_{i+1}}$$

The division of the population $\xi$ being performed as below:

$$X \in \xi \begin{cases} \text{if } X < X^*_1 & \text{then} \quad X \in \xi_1 \\ \text{if } X \geq X^*_{k-1} & \text{then} \quad X \in \xi_k \\ \text{if } X^*_{i-1} \leq X < X^*_1 & \text{then} \quad X \in \xi_i\, i = 2, K = 1 \end{cases}$$

K segments, corresponding to K classes of sample units are thus obtained.

The process of the invention can then be extended directly to the multivariables case. If each sample unit is described by n explanatory variables $x_j$ (j=1, n) in $R^n$, it is possible to compute for each of these variables the optimal threshold $X''_j$. Then from these n variables the one that offers the best discrimination possible should be chosen. This discrimination measured by associating with it an index of internal precision the segment, which measures the goodness of fit between the partition, the explanatory variable selected and the class. This measurement is derived from the index $\omega^j_{12}$ defined previously, and extended to the multiclasses case:

$\omega^j_s$: index of internal precision of segment S according to explanatory variable $X_j$.

$$\omega^j_{12} = \sum_{i=1}^{K} \sum_X P(X, W_i) \cdot \text{Log}\left(\frac{P(X|W_i)}{P(X)}\right)$$

K represents the total number of classes present in segment S. Segment S is then divided into a number of child segments corresponding to the number of representative classes among the K classes represented in this segment. As in the dichotomous case, the following division will be the one that exhibits the strongest precision index.

The stop test is performed in the following manner. A child segment will be terminal if it verifies the stop test defined in the case of two classes (reduction of the impurity, maximum precision, minimum number of sample units in the segment). The class of the majority points in this segment are then assigned to it. The procedure continues as long as a nonterminal segment remains.

According to a variant of the process of the invention, the procedure is followed by splitting the parent segments according to a number of child segments greater than the number of meaningful classes, this to allow for the multiple modalities of one or of several classes or to create rejection segments into which the data that is too indistinct to be effectively segmented is placed.

According to another variant, another mathematical definition of the computation of the optimal splits is adopted from various parametric choices, for example by using laws of probability other than Gaussian laws.

According to yet another variant, qualitative variables previously receded digitally, for example by coding of the colors by their wavelength, or for example if there are large, medium and small sample units, digital values are assigned to their surface or to their volume.

I claim:

1. A segmentation and classification process, comprising the steps of:
   determining if a data base includes classes of representative sample units to be discriminated for which a statistical law exists defining said classes of representative sample units;
   estimating statistical laws defining said classes of representative sample units, when said determining step determines that said statistical law is not available;
   ordering said classes of representative sample units using characteristic variables of said classes;
   segmenting said database in at least as many parts as appear in said database by determining splits discriminating the ordered classes by comparing the ordered classes with each other; and
   classifying an input sample by performing the steps of:
   determining a probability of said input sample being included in each of said classes by evaluating at least one characteristic variable of said input sample;
   classifying said sample into one of said classes having a highest probability of including said sample;
   wherein said method is a shape recognition and discrimination method and the sample units contain physical features used for shape recognition and discrimination and said at least one characteristic variable which is evaluated includes at least one of color, size, surface, and volume.

2. A process according to claim 1, further comprising the step of:
   determining one of said characteristic variables used by said ordering step and said step of determining a probability from said characteristic variables which provides a best possible discrimination under a chosen criterion, said criterion being optimum when a distribution of data within the ordered classes is gaussian, the best possible discrimination between classes also being obtained by minimization of a variance within each of the classes and maximization of a variance between the classes.

3. A process according to claim 1, wherein the segmentation step is performed until a predetermined threshold of impurities remain in said classes.

4. A process according to claim 1, wherein said classes contain impurities and after segmentation is performed in said segmentation step, a stop test is performed which determines if impurities within said classes will be reduced by performing further segmenting and if further segmenting will not reduce impurities within said classes, said segmentation step is terminated.

5. A process according to claim 4, wherein said stop test performs at least one of the follow verifications: acceptable impurity threshold of a classification, minimum number of a classification, maximum number of classifications, and maximum number of segmentation levels.

6. A shape recognition and discrimination method which uses a segmentation and classification process, comprising the steps of:

obtaining sample units containing physical features used for shape recognition and discrimination including at least one of color, size, surface, and volume and placing the sample units in a database;

determining if the data base includes classes of representative sample units to be discriminated for which a statistical law exists defining said classes of representative sample units;

estimating statistical laws defining said classes of representative sample units, when said determining step determines that said statistical law is not available;

ordering said classes of representative sample units using characteristic variables of said classes;

segmenting said database in at least as many parts as appear in said database by determining splits discriminating the ordered classes by comparing the ordered classes with each other; and classifying an input sample by performing the steps of:

determining a probability of said input sample being included in each of said classes by evaluating at least one characteristic variable of said input sample; and classifying said sample into one of said classes having a highest probability of including said sample, thereby performing shape recognition and discrimination.

7. A method according to claim 6, further comprising the step of:

determining one of said characteristic variables used by said ordering step and said step of determining a probability from said characteristic variables which provides a best possible discrimination under a chosen criterion, said criterion being optimum when a distribution of data within the ordered classes is gaussian, the best possible discrimination between classes also being obtained by minimization of a variance within each of the classes and maximization of a variance between the classes.

8. A method according to claim 6, wherein the segmentation step is performed until a predetermined threshold of impurities remain in said classes.

9. A method according to claim 6, wherein said classes contain impurities and after segmentation is performed in said segmentation step, a stop test is performed which determines if impurities within said classes will be reduced by performing further segmenting and if further segmenting will not reduce impurities within said classes, said segmentation step is terminated.

10. A method according to claim 9, wherein said stop test performs at least one of the follow verifications: acceptable impurity threshold of a classification, minimum number of a classification, maximum number of classifications, and maximum number of segmentation levels.

11. A method for discriminating different objects, images or systems using a segmentation and classification process, comprising the steps of:

obtaining sample units containing physical features used for shape recognition and discrimination including at least one of color, size, surface, and volume and placing the sample units in a database;

determining if a data base includes classes of representative sample units to be discriminated for which a statistical law exists defining said classes of representative sample units;

estimating statistical laws defining said classes of representative sample units, when said determining step determines that said statistical law is not available;

ordering said classes of representative sample units using characteristic variables of said classes;

segmenting said database in at least as many parts as appear in said database by determining splits discriminating the ordered classes by comparing the ordered classes with each other; and classifying an input sample by performing the steps of:

determining a probability of said input sample being included in each of said classes by evaluating at least one characteristic variable of said input sample;

classifying said sample into one of said classes having a highest probability of including said sample, thereby performing discrimination.

* * * * *